United States Patent
Ikegami et al.

(10) Patent No.: US 8,004,014 B2
(45) Date of Patent: Aug. 23, 2011

(54) SEMICONDUCTOR INTEGRATED CIRCUIT DEVICE HAVING METAL INTERCONNECT REGIONS PLACED SYMMETRICALLY WITH RESPECT TO A CELL BOUNDARY

(75) Inventors: Tomoaki Ikegami, Kyoto (JP); Hidetoshi Nishimura, Osaka (JP); Kazuyuki Nakanishi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/542,263

(22) Filed: Aug. 17, 2009

(65) Prior Publication Data

US 2010/0001404 A1    Jan. 7, 2010

Related U.S. Application Data

(63) Continuation of application No. PCT/JP2009/000801, filed on Feb. 24, 2009.

(30) Foreign Application Priority Data

Jul. 4, 2008    (JP) .................................. 2008-176143

(51) Int. Cl.
*H01L 23/52* (2006.01)
*H01L 27/04* (2006.01)
(52) U.S. Cl. ........... 257/202; 257/E23.141; 257/E27.07; 257/E27.06; 257/E23.001; 257/773; 257/368; 257/431; 257/432; 257/438; 257/213
(58) Field of Classification Search .................. 257/773, 257/E23.141, E27.07, 202, E27.108, 368, 257/27.06, 431, 432, 438, E23.001, E27.06, 257/213
See application file for complete search history.

(56) References Cited

U.S. PATENT DOCUMENTS

| | | | |
|---|---|---|---|
| 5,847,421 A | 12/1998 | Yamaguchi | |
| 7,205,191 B2 * | 4/2007 | Kobayashi | ..................... 438/238 |
| 7,233,513 B2 * | 6/2007 | Kamoshida et al. | ............. 365/63 |
| 7,476,957 B2 * | 1/2009 | Watanabe et al. | ............. 257/499 |
| 7,800,191 B2 * | 9/2010 | Ohtsuki et al. | ................. 257/431 |
| 2005/0001271 A1 | 1/2005 | Kobayashi | |
| 2005/0205894 A1 | 9/2005 | Sumikawa et al. | |
| 2009/0159977 A1 * | 6/2009 | Itou | ............................... 257/368 |

FOREIGN PATENT DOCUMENTS

| | | |
|---|---|---|
| JP | 10-032253 | 2/1998 |
| JP | 2004-342757 | * 12/2004 |
| JP | 2007-110166 | 4/2007 |
| JP | 2007-317814 | 12/2007 |

OTHER PUBLICATIONS

Front page of published International Application and International Search Report issued in International Application No. PCT/JP2009/000801 filed Feb. 24, 2009.

* cited by examiner

*Primary Examiner* — Alexander O Williams
(74) *Attorney, Agent, or Firm* — McDermott Will & Emery LLP

(57) ABSTRACT

A layout structure of a semiconductor integrated circuit is provided with which narrowing and breaking of metal interconnects near a cell boundary can be prevented without increasing the data amount and processing time for OPC. A cell A and a cell B are adjacent to each other along a cell boundary. The interconnect regions of metal interconnects from which to the cell boundary no other interconnect region exists are placed to be substantially axisymmetric with respect to the cell boundary, while sides of diffusion regions facing the cell boundary are asymmetric with respect to the cell boundary.

25 Claims, 15 Drawing Sheets

SEMICONDUCTOR INTEGRATED CIRCUIT DEVICE HAVING METAL INTERCONNECT REGIONS PLACED SYMMETRICALLY WITH RESPECT TO A CELL BOUNDARY

CROSS-REFERENCE TO RELATED APPLICATIONS

This application is a continuation of International Application No. PCT/JP2009/000801, whose international filing date is Feb. 24, 2009 which in turn claims the benefit of Japanese Patent Application No. 2008-176143, filed on Jul. 4, 2008, the disclosures of which Applications are incorporated by reference herein. The benefit of the filing and priority dates of the International and Japanese Applications is respectfully requested.

BACKGROUND

The present invention relates to a layout structure of a semiconductor integrated circuit effective in improving the accuracy of the interconnect pattern dimensions.

With increasing reduction in interconnect width due to device miniaturization, the variation in interconnect width caused by an optical proximity effect is becoming non-negligible. The optical proximity effect is a phenomenon that the finished value of the width of a given interconnect varies with the distance from the given interconnect to a nearby interconnect. The optical proximity effect causes degradation of the accuracy of the interconnect dimensions. Therefore, depending on the interconnect spacing, the interconnect width may possibly become smaller than a specified value, and in some cases, even be broken, under the influence of the optical proximity effect.

Under the circumstances described above, correction for an influence of the optical proximity effect, or optical proximity effect correction (OPC), is indispensable. The OPC is a technique in which a variation of the interconnect width occurring depending on the interconnect spacing is predicted, and correction is made to cancel the variation, to thereby keep the finished interconnect uniform.

For example, a technique disclosed in Patent Document 1 is known for measures taken for polysilicon interconnects.
Patent Document 1: Japanese Laid-Open Patent Publication No. 10-32253

SUMMARY

In design of a semiconductor integrated circuit, layout design is normally performed by placing standard cells registered in a library. In this case, as for a metal interconnect in a given cell located closest to a cell boundary of the cell, the distance from this metal interconnect to a nearby interconnect varies depending on the layout structure of a cell placed adjacent to the given cell.

Hence, the metal interconnect closest to the cell boundary must be subjected to OPC after the cells are placed and then the distance from the metal interconnect to the nearby interconnect is determined. Otherwise, in a 65 nm or finer process, in particular, the metal interconnect closest to the cell boundary may possibly be narrowed, and even be broken, under the influence of the optical proximity effect. However, if OPC is performed after the cell placement, such problems will arise that the data amount for OPC may increase and also the OPC processing time may be long.

To address the above problems, an object of the present invention is to provide a layout structure of a semiconductor integrated circuit with which narrowing and breaking of a metal interconnect close to a cell boundary can be prevented without increasing the data amount and processing time for OPC.

The semiconductor integrated circuit device of the present invention includes first and second standard cells that are different in cell structure from each other and placed adjacent to each other along a cell boundary extending in a first direction, wherein in the first and second standard cells, rectangular interconnect regions that extend in the first direction and from which to the cell boundary no other interconnect region exists are placed to be substantially axisymmetric with respect to the cell boundary, and sides, facing the cell boundary, of diffusion regions from which to the cell boundary no other diffusion region exists are asymmetric with respect to the cell boundary.

According to the present invention, in the adjacent first and second standard cells, rectangular interconnect regions from which to a cell boundary no other interconnect region exists, that is, interconnect regions closest to the cell boundary, are placed to be substantially axisymmetric with respect to the cell boundary. Hence, the distance from an interconnect region closest to the cell boundary to a nearby interconnect will be determined before placement of the standard cells. This makes it possible to predict the magnitude of a variation in interconnect width due to the optical proximity effect, and hence perform OPC in the state of standard cells. As a result, OPC is no more necessary after cell placement, and this can reduce the data amount for OPC and also shorten the OPC processing time.

Alternatively, the semiconductor integrated circuit device of the present invention includes first and second standard cells that are different in cell structure from each other and placed adjacent to each other along a cell boundary extending in a first direction, wherein in the first and second standard cells, rectangular interconnect regions that extend in the first direction and from which to the cell boundary no other interconnect region exists are asymmetric with respect to the cell boundary, when a gap of a predetermined length or less is regarded as non-existent, the interconnect regions are substantially axisymmetric with respect to the cell boundary, and the predetermined length is the length of a gap that can be substantially regarded as non-existent from the standpoint of the optical proximity effect.

According to the present invention, in the adjacent first and second standard cells, interconnect regions from which to a cell boundary no other interconnect region exists are placed to be substantially axisymmetric with respect to the cell boundary when a gap of a predetermined length or less is regarded as non-existing. Hence, the distance from an interconnect region closest to the cell boundary to a nearby interconnect will be determined before placement of the standard cells. This makes it possible to predict the magnitude of a variation in interconnect width due to the optical proximity effect, and hence perform OPC in the state of the standard cells. As a result, OPC is no more necessary after cell placement, and this can reduce the data amount for OPC and also shorten the OPC processing time.

As described above, according to the present invention, narrowing and breaking of metal interconnects closest to a cell boundary can be prevented without increasing the data amount and processing time for OPC.

DETAILED DESCRIPTION

Hereinafter, embodiments of the present invention will be described with reference to the accompanying drawings.

Embodiment 1

Figure 1:
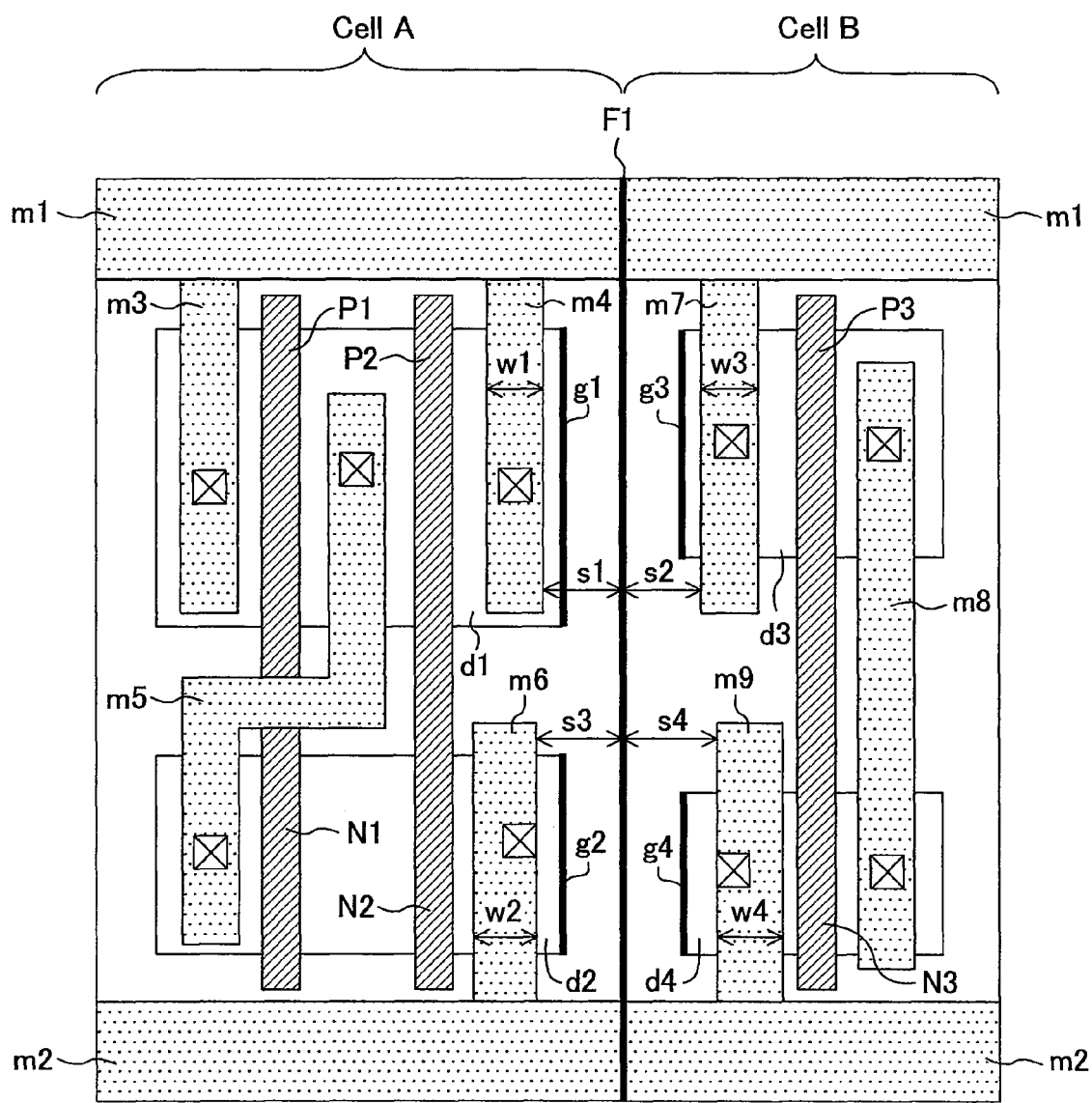
FIG. 1 is a layout plan view showing a configuration of a semiconductor integrated circuit device of Embodiment 1.

FIG. 1 is a layout plan view showing a configuration of a semiconductor integrated circuit device of Embodiment 1. In the configuration of FIG. 1, a cell A as the first standard cell and a cell B as the second standard cell are adjacent to each other along a cell boundary F1 extending in a first direction (vertical as viewed from the figure).

The cell A and the cell B have different cell structures from each other. In the cell A, PMOS transistors P1 and P2 and NMOS transistors N1 and N2 are placed. A power supply voltage is supplied to the sources of the PMOS transistors P1 and P2 via metal interconnects m3 and m4, respectively, drawn from a power supply line m1. The drains of the PMOS transistors P1 and P2 are shared and connected to the drain of the NMOS transistor N1 via a metal interconnect m5. The metal interconnect m5 constitutes the output of the cell A. A ground voltage is supplied to the source of the NMOS transistor N2 via a metal interconnect m6 drawn from a ground line m2. The cell A having this configuration implements a predetermined circuit function.

Likewise, in the cell B, a PMOS transistor P3 and an NMOS transistor N3 are placed. The power supply voltage is supplied to the source of the PMOS transistor P3 via a metal interconnect m7 drawn from the power supply line m1. The drain of the PMOS transistor P3 is connected to the drain of the NMOS transistor N3 via a metal interconnect m8. The metal interconnect m8 constitutes the output of the cell B. The ground voltage is supplied to the source of the NMOS transistor N3 via a metal interconnect m9 drawn from the ground line m2. The cell B having this configuration also implements a predetermined circuit function.

In the above configuration, pay attention to interconnect regions near a cell boundary F1. In this embodiment, rectangular interconnect regions including the metal interconnects m4, m6, m7, and m9 that extend in the same direction as the cell boundary F1 and are closest to the cell boundary F1 (i.e., from which to the cell boundary F1 no other interconnect region exists) are placed to be substantially axisymmetric with respect to the cell boundary F1 as the symmetry axis.

Specifically, in comparison between the metal interconnect m4 and the metal interconnect m7, their interconnect widths w1 and w3 are equal to each other, and their distances s1 and s2 to the cell boundary F1 are equal to each other. Also, the lengths (ranges in the direction of the cell boundary F1) thereof are substantially equal to each other. Likewise, in comparison between the metal interconnect m6 and the metal interconnect m9, their interconnect widths w2 and w4 are equal to each other, and their distances s3 and s4 to the cell boundary F1 are equal to each other. Also, the lengths (ranges in the direction of the cell boundary F1) thereof are equal to each other.

In the configuration of FIG. 1, the sizes of diffusion regions close to the cell boundary F1 are different between the cell A and the cell B. In other words, sides g1 and g2, facing the cell boundary F1, of diffusion regions d1 and d2 that are closest to the cell boundary F1 (i.e., from which to the cell boundary F1 no other diffusion region exists) in the cell A are asymmetric, not axisymmetric, with sides g3 and g4, facing the cell boundary F1, of diffusion regions d3 and d4 that are closest to the cell boundary F1 (i.e., from which to the cell boundary F1 no other diffusion region exists) in the cell B, with respect to the cell boundary F1.

In the above configuration, according to the conventional technique, the metal interconnects m7 and m9 in the cell B are normally made short to match with the small-sized diffusion regions d3 and d4. Hence, the metal interconnects m7 and m9 fail to be axisymmetric with the metal interconnects m4 and m6 in the adjacent cell A with respect to the cell boundary F1.

In this embodiment, however, despite the difference in the sizes of the diffusion regions close to the cell boundary F1 between the cell A and the cell B, the metal interconnects m7 and m9 in the cell B are made long so as to be axisymmetric with the metal interconnects m4 and m6 in the adjacent cell A with respect to the cell boundary F1.

Accordingly, the magnitude of a variation in interconnect width due to the optical proximity effect can be predicted in advance for the metal interconnects near the cell boundary F1, and this permits execution of OPC in the state of standard cells. As a result, OPC is no more necessary after cell placement, and this can reduce the data amount for OPC and also shorten the OPC processing time.

Figure 2:
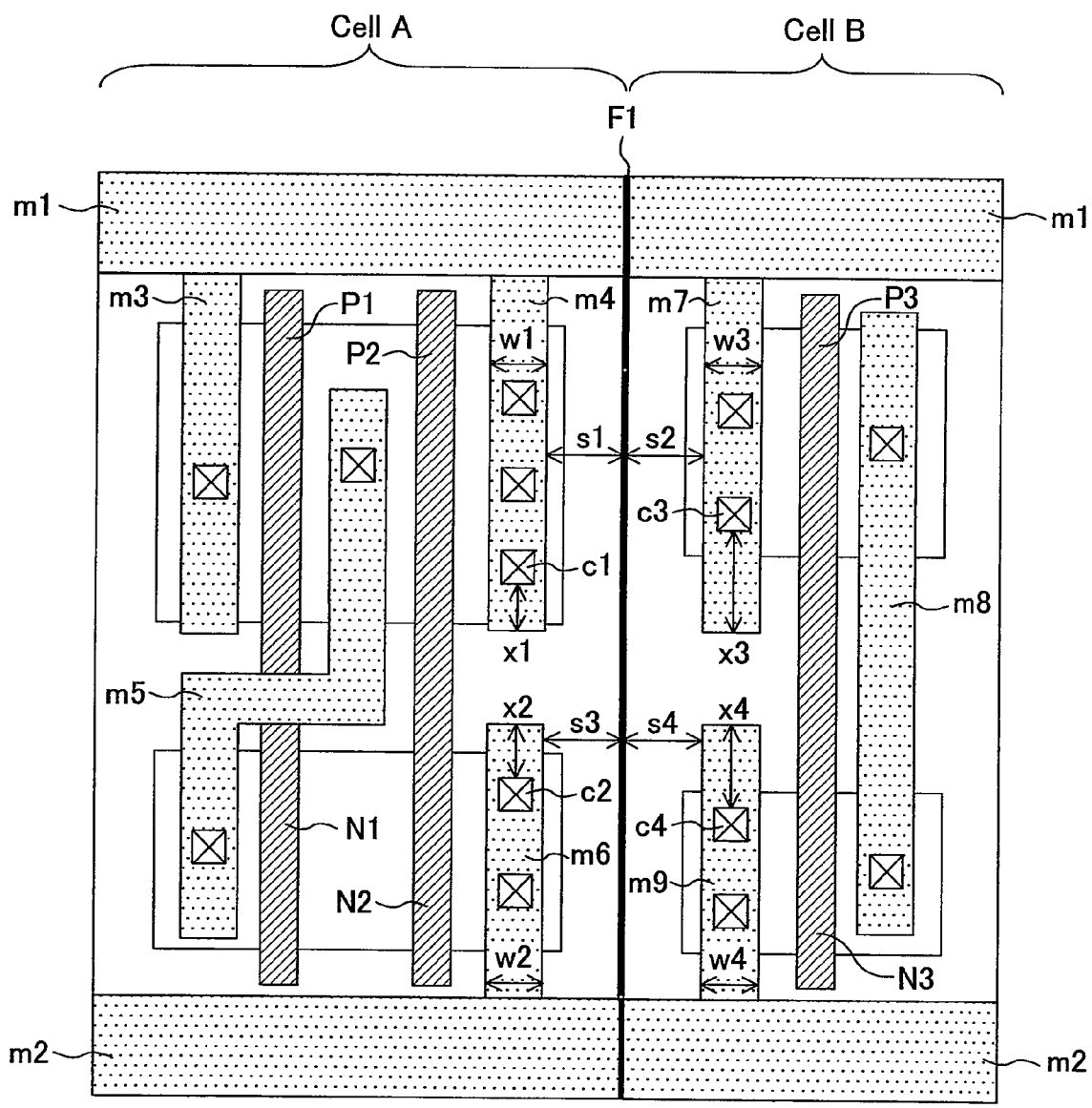
FIG. 2 is a layout plan view showing another configuration of the semiconductor integrated circuit device of Embodiment 1.

FIG. 2 is a layout plan view showing another configuration of the semiconductor integrated circuit device of this embodiment. In FIG. 2, the configurations of the cell A and the cell B are similar to those in FIG. 1. As in FIG. 1, the rectangular interconnect regions including the metal interconnects m4, m6, m7, and m9 that extend in the same direction as the cell boundary F1 and are closest to the cell boundary F1 are placed to be substantially axisymmetric with respect to the cell boundary F1. In these rectangular interconnect regions, however, the placement of contacts is asymmetric with respect to the cell boundary F1.

In the configuration of FIG. 2, an extension x3 for a contact c3 in the metal interconnect m7 is made long compared with an extension x1 for a contact c1 in the metal interconnect m4, so that the metal interconnect m4 and the metal interconnect m7 are axisymmetric with respect to the cell boundary F1. Likewise, an extension x4 for a contact c4 in the metal interconnect m9 is made long compared with an extension x2 for a contact c2 in the metal interconnect m6, so that the metal interconnect m6 and the metal interconnect m9 are axisymmetric with respect to the cell boundary F1.

With the configuration of FIG. 2, also, the magnitude of a variation in interconnect width due to the optical proximity effect can be predicted in advance for the metal interconnects near the cell boundary F1, and this permits execution of OPC in the state of standard cells. As a result, OPC is no more necessary after cell placement, and this can reduce the data amount for OPC and also shorten the OPC processing time.

Moreover, by extending the regions of metal interconnects, the area occupation of the metal interconnect layer can be increased, and hence the thickness of the metal interconnect layer in a cell can be kept uniform. Also, the prolonged extension for a contact improves the yield.

Figure 3:
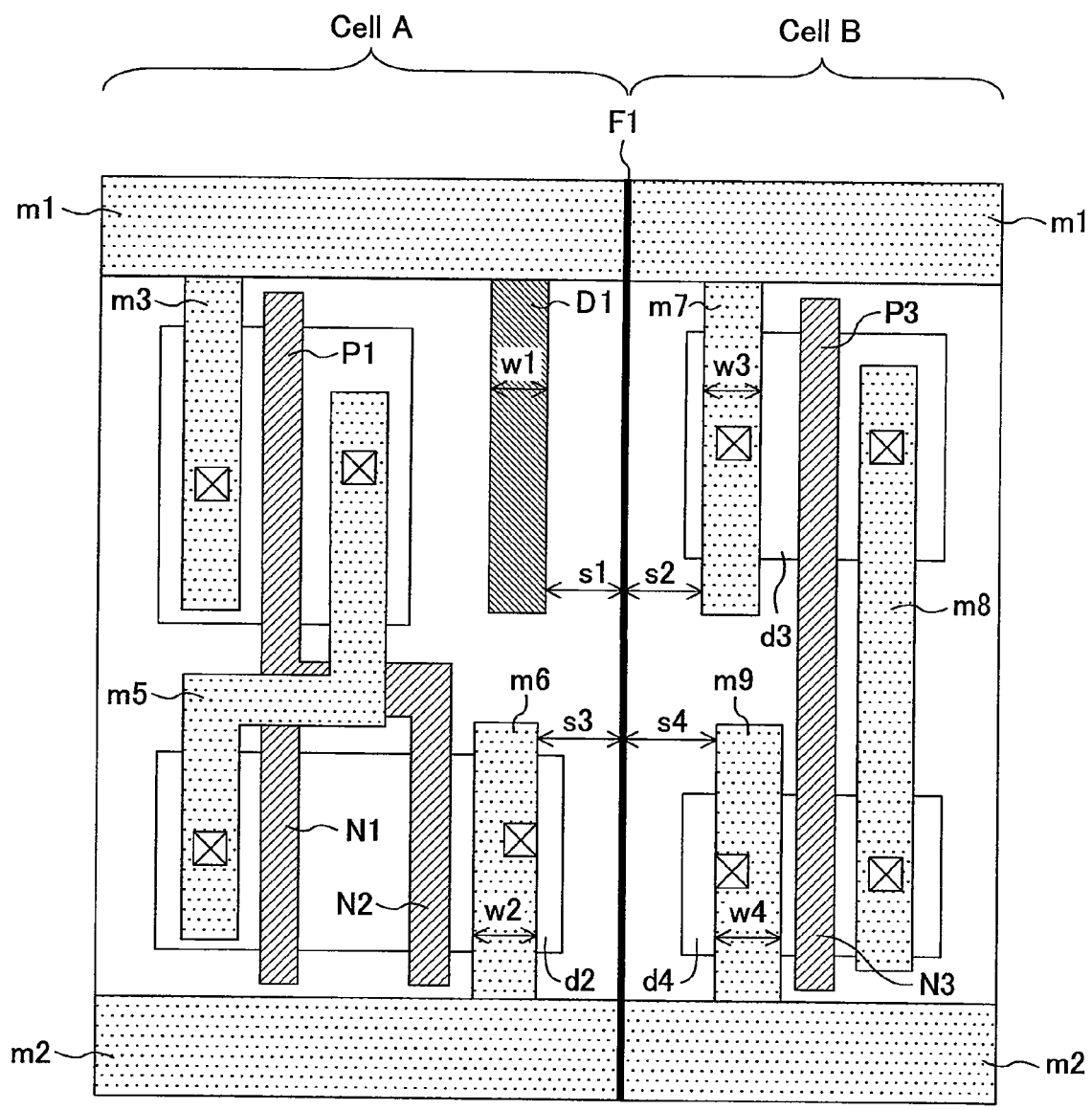
FIG. 3 is a layout plan view showing yet another configuration of the semiconductor integrated circuit device of Embodiment 1.

FIG. 3 is a layout plan view showing yet another configuration of the semiconductor integrated circuit device of this embodiment. In FIG. 3, the configuration of the cell A is different from that in FIG. 1 in that the PMOS transistor P2 does not exist and both the NMOS transistors N1 and N2 are connected to the PMOS transistor P1.

In the configuration of FIG. 3, a dummy interconnect D1 of a metal interconnect is placed near the cell boundary F1 in the cell A. The rectangular interconnect regions including the metal interconnects D1, m6, m7, and m9 that extend in the same direction as the cell boundary F1 and are closest to the cell boundary F1 are placed to be substantially axisymmetric with respect to the cell boundary F1.

According to the conventional technique, the dummy interconnect D1 is not normally placed in the cell A, and hence the metal interconnect m7 in the adjacent cell B has no counterpart interconnect region axisymmetric with respect to the cell boundary F1. In this case, the distance between the metal interconnect m7 and a nearby metal interconnect cannot be determined within the cell.

By placing the dummy interconnect D1 in the cell A as shown in FIG. 3, the magnitude of a variation in interconnect width due to the optical proximity effect can be predicted in advance for the metal interconnect m7 near the cell boundary F1, and this permits execution of OPC in the state of standard cells. As a result, OPC is no more necessary after cell placement, and this can reduce the data amount for OPC and also shorten the OPC processing time.

Embodiment 2

Figure 4:
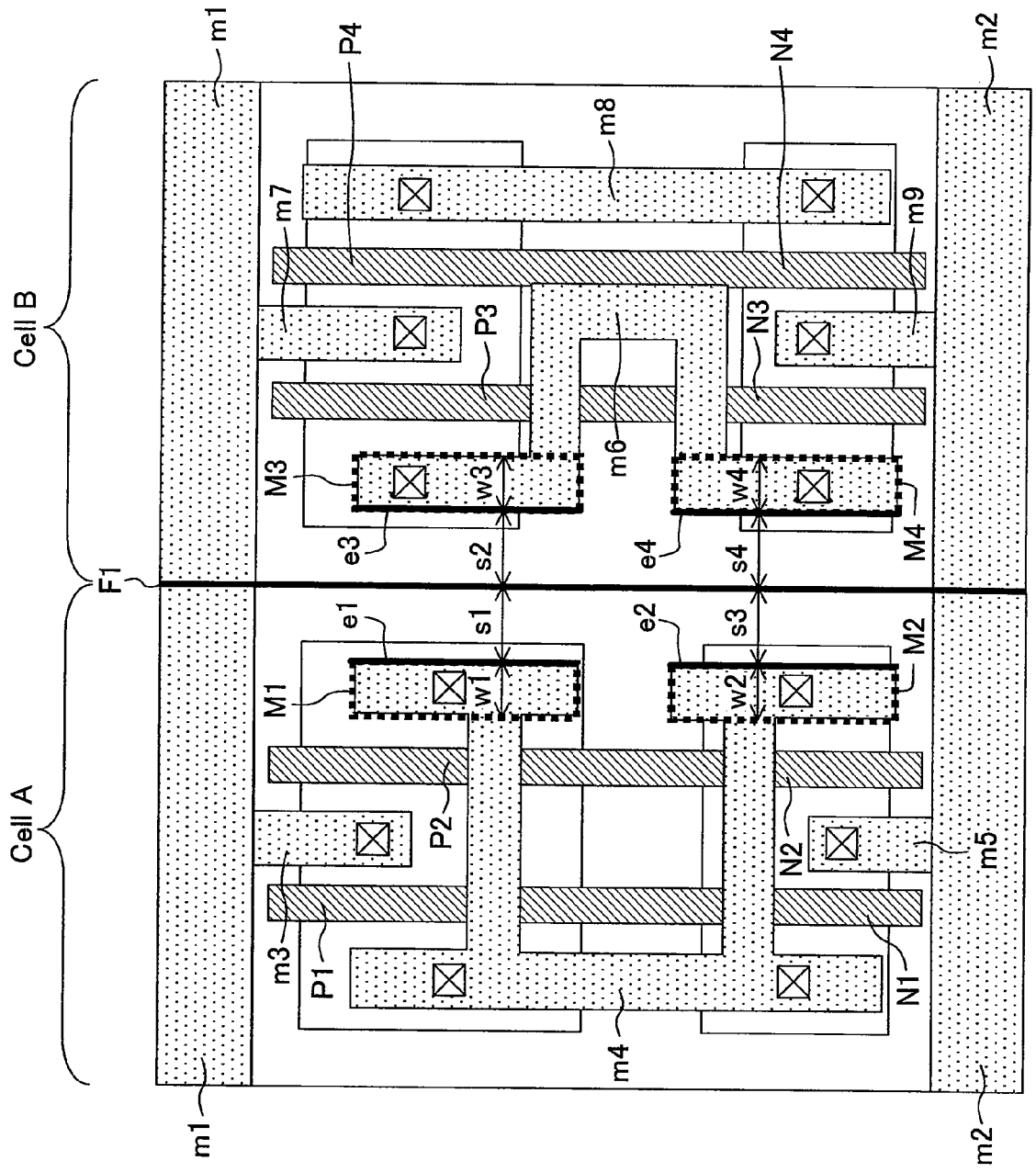
FIG. 4 is a layout plan view showing a configuration of a semiconductor integrated circuit device of Embodiment 2.

FIG. 4 is a layout plan view showing a configuration of a semiconductor integrated circuit device of Embodiment 2. In the configuration of FIG. 4, a cell A as the first standard cell and a cell B as the second standard cell are adjacent to each other along a cell boundary F1 extending in a first direction (vertical as viewed from the figure).

The cell A and the cell B have different cell structures from each other. In the cell A, PMOS transistors P1 and P2 and NMOS transistors N1 and N2 are placed. The sources of the PMOS transistors P1 and P2 are shared, to which a power supply voltage is supplied via a metal interconnect m3 drawn from a power supply line m1. The drains of the PMOS transistors P1 and P2 are connected together via a metal interconnect m4 and further connected to the drains of the NMOS transistors N1 and N2. The metal interconnect m4 constitutes the output of the cell A. The sources of the NMOS transistors N1 and N2 are shared, to which a ground voltage is supplied via a metal interconnect m5 drawn from a ground line m2. The cell A having this configuration implements a predetermined circuit function.

Likewise, in the cell B, PMOS transistors P3 and P4 and NMOS transistors N3 and N4 are placed. The sources of the PMOS transistors P3 and P4 are shared, to which the power supply voltage is supplied via a metal interconnect m7 drawn from the power supply line m1. The drain of the PMOS transistor P3 is connected to the drain of the NMOS transistor N3 via a metal interconnect m6. The drain of the PMOS transistor P4 is connected to the drain of the NMOS transistor N4 via a metal interconnect m8. The metal interconnect m8 constitutes the output of the cell B. The sources of the NMOS transistors N3 and N4 are shared, to which the ground voltage is supplied via a metal interconnect m9 drawn from the ground line m2. The cell B having this configuration implements a predetermined circuit function In the cell A, the metal interconnect m4 includes: a rectangular interconnect region (portion surrounded by a broken line) M1 having a side e1 close to the cell boundary F1; and a rectangular interconnect region (portion surrounded by a broken line) M2 having a side e2 close to the cell boundary F1. In the cell B, like the cell A, the metal interconnect m6 includes: a rectangular interconnect region (portion surrounded by a broken line) M3 having a side e3 close to the cell boundary F1; and a rectangular interconnect region (portion surrounded by a broken line) M4 having a side e4 close to the cell boundary F1. The interconnect regions M1, M2, M3, and M4 are rectangular interconnect regions that are closest to the cell boundary F1, that is, from which to the cell boundary F1 no other interconnect region exists.

In this embodiment, the rectangular interconnect regions M1, M2, M3, and M4 that extend in the same direction as the cell boundary F1 and are closest to the cell boundary F1 are placed to be substantially axisymmetric with respect to the cell boundary F1.

Specifically, in comparison between the interconnect region M1 and the interconnect region M3, their interconnect widths w1 and w3 are equal to each other, and their distances s1 and s2 to the cell boundary F1 are equal to each other. Also, the lengths thereof along the cell boundary F1 (i.e., the lengths of the sides e1 and e3) and the ranges thereof are equal to each other. Likewise, in comparison between the interconnect region M2 and the interconnect region M4, their interconnect widths w2 and w4 are equal to each other, and their distances s3 and s4 to the cell boundary F1 are equal to each other. Also, the lengths thereof along the cell boundary F1 (i.e., the lengths of the sides e2 and e4) and the ranges thereof are equal to each other.

Having the above configuration, the magnitude of a variation in interconnect width due to the optical proximity effect can be predicted in advance for the metal interconnects near the cell boundary F1, and this permits execution of OPC in the state of standard cells. As a result, OPC is no more necessary after cell placement, and this can reduce the data amount for OPC and also shorten the OPC processing time.

Figure 5:
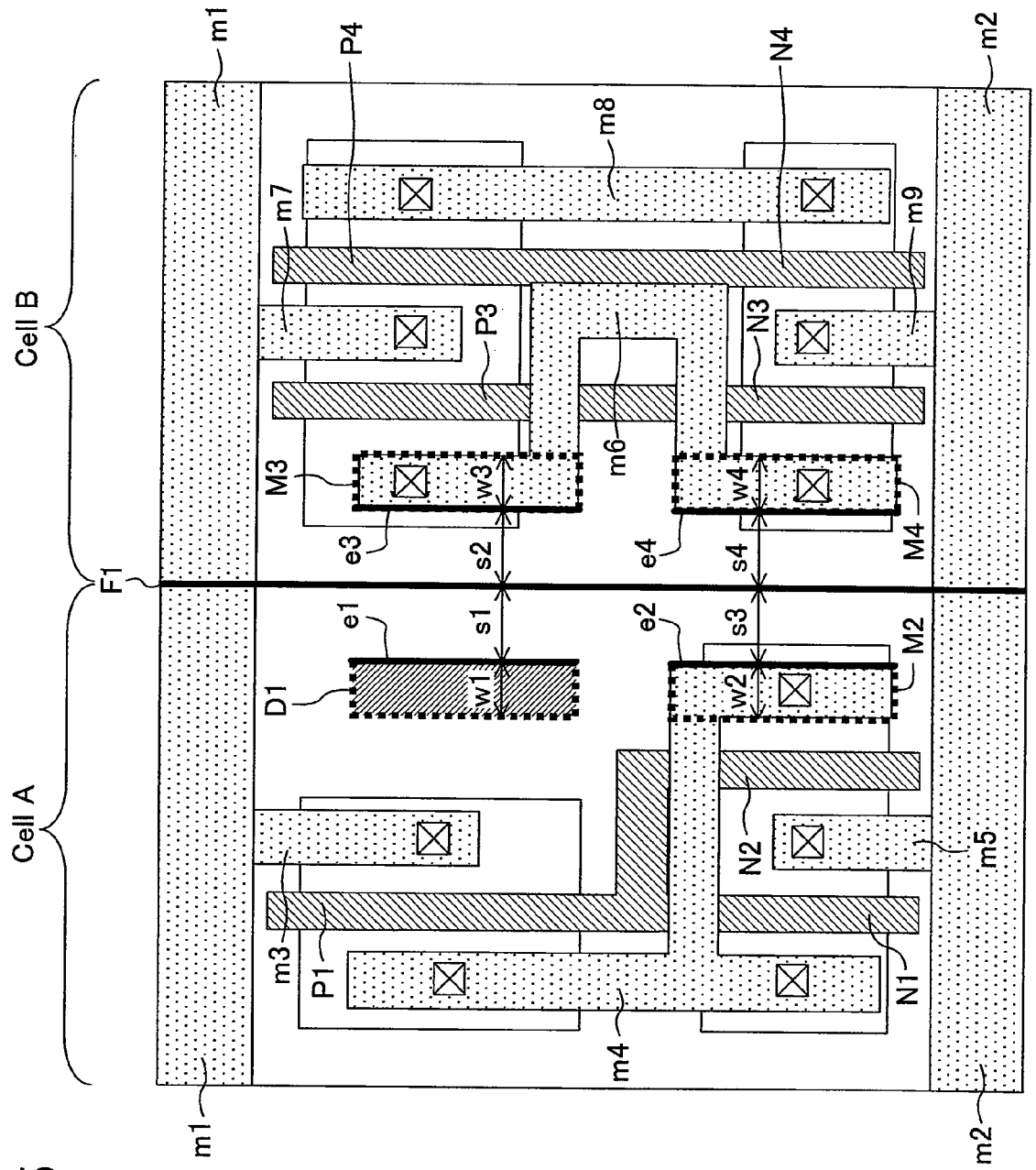
FIG. 5 is a layout plan view showing another configuration of the semiconductor integrated circuit device of Embodiment 2.

FIG. 5 is a layout plan view showing another configuration of the semiconductor integrated circuit device of this embodiment. In FIG. 5, the configuration of the cell A is different from that in FIG. 4 in that the PMOS transistor P2 does not exist and both the NMOS transistors N1 and N2 are connected to the PMOS transistor P1.

In the configuration of FIG. 5, a dummy interconnect D1 of a metal interconnect is placed in the cell A near the cell boundary F1. The rectangular interconnect region of the metal interconnect D1 and the interconnect regions M2, M3, and M4 that extend in the same direction as the cell boundary F1 and are closest to the cell boundary F1 are placed to be substantially axisymmetric with respect to the cell boundary F1.

According to the conventional technique, the dummy interconnect D1 is not normally placed in the cell A, and hence the interconnect region M3 in the adjacent cell B has no counterpart interconnect region axisymmetric with respect to the cell boundary F1. In this case, the distance from the interconnect region M3 to a nearby metal interconnect cannot be determined within the cell.

By placing the dummy interconnect D1 in the cell A as shown in FIG. 5, the magnitude of a variation in interconnect width due to the optical proximity effect can be predicted in advance for the interconnect region M3 of the metal interconnect m6 near the cell boundary F1, and this permits execution of OPC in the state of standard cells. As a result, OPC is no more necessary after cell placement, and this can reduce the data amount for OPC and also shorten the OPC processing time.

Figure 6:
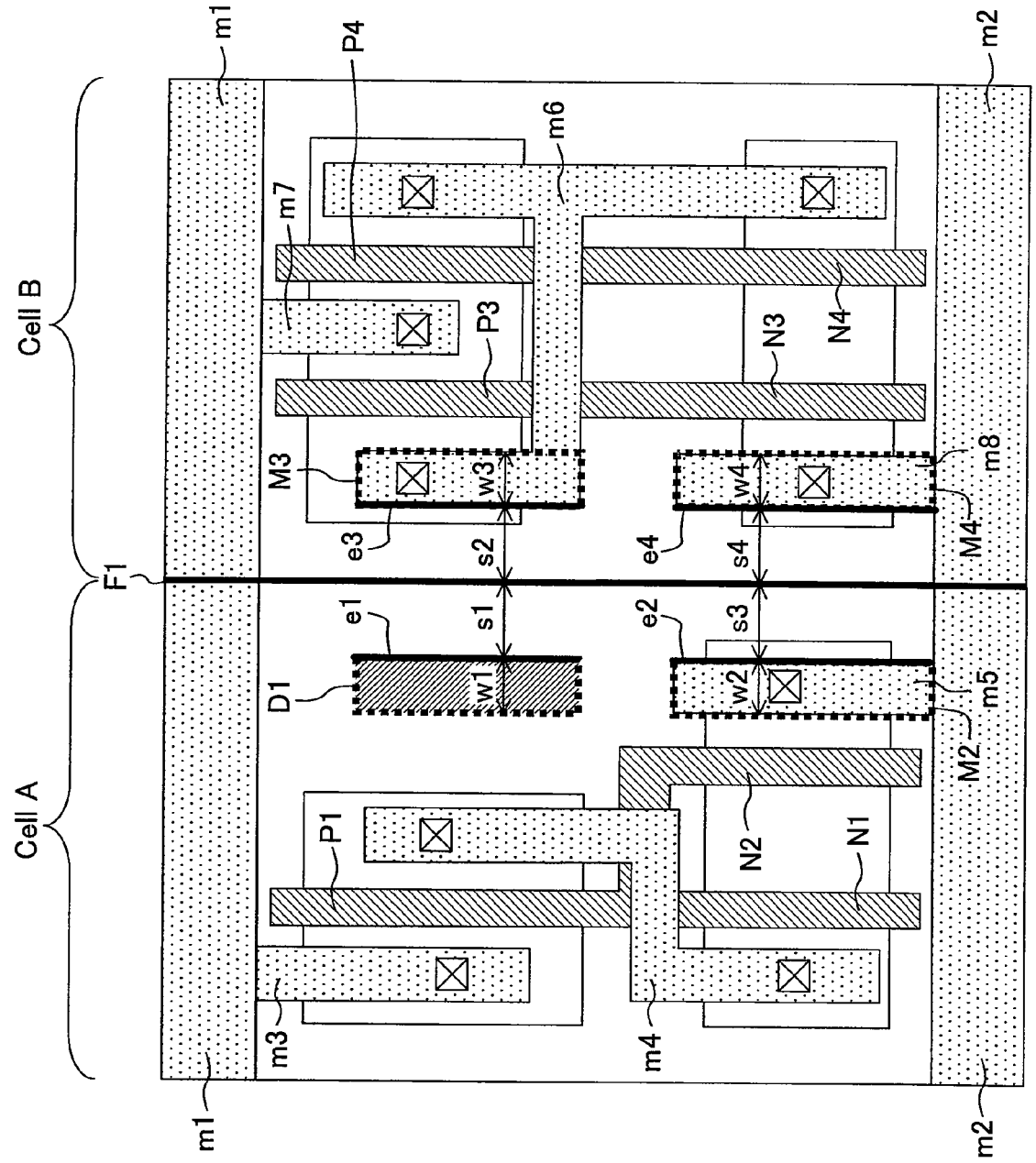
FIG. 6 is a layout plan view showing yet another configuration of the semiconductor integrated circuit device of Embodiment 2.

FIG. 6 is a layout plan view showing yet another configuration of the semiconductor integrated circuit device of this embodiment. In FIG. 6, the configurations of the cell A and the cell B are different from those in FIG. 4.

In the configuration of FIG. 6, also, the rectangular interconnect region of the dummy interconnect D1, the rectangular interconnect region M2 of a metal interconnect m5, the rectangular interconnect region M3 of a metal interconnect m6, and the rectangular interconnect region M4 of a metal interconnect m8 that extend in the same direction as the cell boundary F1 and are closest to the cell boundary F1 are placed to be substantially axisymmetric with respect to the cell boundary F1.

Having the above configuration, the magnitude of a variation in interconnect width due to the optical proximity effect can be predicted in advance for the metal interconnects near the cell boundary F1, and this permits execution of OPC in the state of standard cells. As a result, OPC is no more necessary after cell placement, and this can reduce the data amount for OPC and also shorten the OPC processing time.

Embodiment 3

Figure 7:
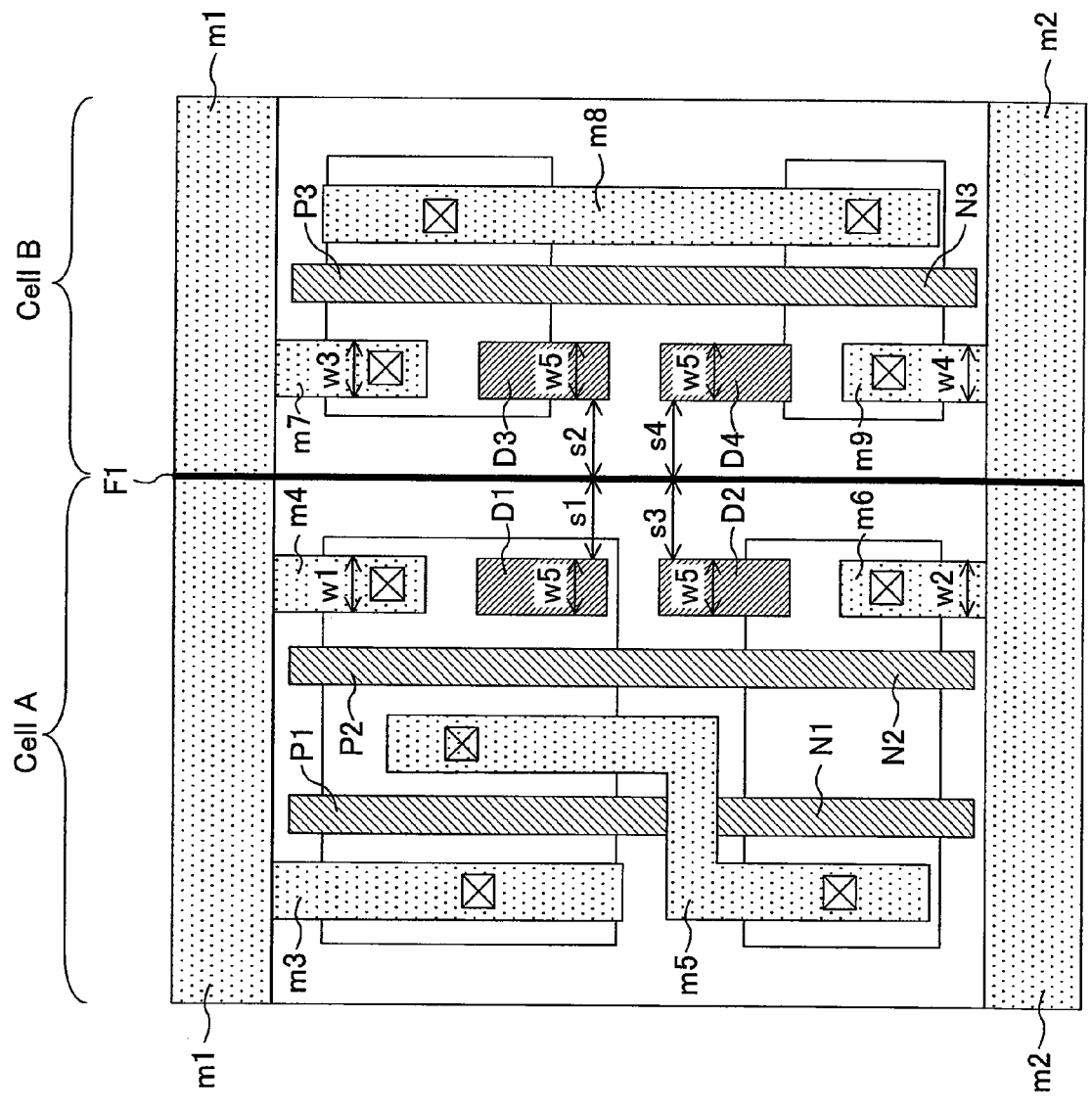
FIG. 7 is a layout plan view showing a configuration of a semiconductor integrated circuit device of Embodiment 3.

FIG. 7 is a layout plan view showing a configuration of a semiconductor integrated circuit device of Embodiment 3. In the configuration of FIG. 7, a cell A as the first standard cell and a cell B as the second standard cell are adjacent to each other along a cell boundary F1 extending in a first direction (vertical as viewed from the figure).

The cell A and the cell B have different cell structures from each other. In the cell A, PMOS transistors P1 and P2 and NMOS transistors N1 and N2 are placed. A power supply voltage is supplied to the sources of the PMOS transistors P1 and P2 via metal interconnects m3 and m4, respectively, drawn from a power supply line m1. The drains of the PMOS transistors P1 and P2 are shared and connected to the drain of the NMOS transistor N1 via a metal interconnect m5. The metal interconnect m5 constitutes the output of the cell A. A ground voltage is supplied to the source of the NMOS transistor N2 via a metal interconnect m6 drawn from a ground line m2. The cell A having this configuration implements a predetermined circuit function.

Likewise, in the cell B, a PMOS transistor P3 and an NMOS transistor N3 are placed. The power supply voltage is supplied to the source of the PMOS transistor P3 via a metal interconnect m7 drawn from the power supply line m1. The drain of the PMOS transistor P3 is connected to the drain of the NMOS transistor N3 via a metal interconnect m8. The metal interconnect m8 constitutes the output of the cell B. The ground voltage is supplied to the source of the NMOS transistor N3 via a metal interconnect m9 drawn from the ground line m2. The cell B having this configuration implements a predetermined circuit function.

In the cell A, also, dummy interconnects D1 and D2 are placed between the metal interconnects m4 and m6 closest to the cell boundary F1. Likewise, in the cell B, dummy interconnects D3 and D4 are placed between the metal interconnects m7 and m9 closest to the cell boundary F1. In other words, in the configuration of FIG. 7, the metal interconnects m4 and m6 and the dummy interconnects D1 and D2 in the cell A and the metal interconnects m7 and m9 and the dummy interconnects D3 and D4 in the cell B are placed as rectangular interconnect regions that are closest to the cell boundary F1 (i.e., from which to the cell boundary F1 no other interconnect region exists). The dummy interconnects D1, D2, D3, and D4 have the same width w5, and their distances s1, s2, s3, and s4 to the cell boundary F1 are equal to each other.

In this embodiment, the metal interconnects m4 and m6 and the dummy interconnects D1 and D2 in the cell A and the metal interconnects m7 and m9 and the dummy interconnects D3 and D4 in the cell B are placed to be substantially axisymmetric with respect to the cell boundary F1.

Having the above configuration, the magnitude of a variation in interconnect width due to the optical proximity effect can be predicted in advance for the metal interconnects near the cell boundary F1, and this permits execution of OPC in the state of standard cells. As a result, OPC is no more necessary after cell placement, and this can reduce the data amount for OPC and also shorten the OPC processing time. Also, by placing the dummy interconnects, the regions of metal interconnects can be increased, permitting regulation of the area occupation of the metal interconnect layer. Hence, the thickness of the metal interconnect layer in a cell can be kept uniform, and the yield can be improved.

Note that the dummy interconnects D1, D2, D3, and D4 may be metal interconnects for constituting input/output terminals.

Embodiment 4

In the above embodiments, for the purpose of allowing prediction of the magnitude of a variation in interconnect width due to the optical proximity effect, rectangular interconnect regions in two adjacent cells closest to the cell boundary were placed to be axisymmetric with respect to the cell boundary.

It has been understood that in a configuration having intermittently-placed interconnect regions, such interconnect regions can be regarded as being substantially continuous as one region from the viewpoint of the optical proximity effect as long as the gap between the interconnect regions is minimal. In consideration of this, the interconnect regions themselves may not be necessarily axisymmetric with respect to the cell boundary to provide similar function and effect as those described in the above embodiments.

Specifically, in two adjacent cells, rectangular interconnect regions that extend in the same direction as the cell boundary and from which to the cell boundary no other interconnect region exists are asymmetric with respect to the cell boundary. When a gap of a predetermined length or less is regarded as non-existent, these interconnect regions are substantially axisymmetric with respect to the cell boundary. The predetermined length as used herein refers to the length of a gap that can be regarded as substantially non-existent from the standpoint of the optical proximity effect. In this configuration, although the interconnect regions themselves are not axisymmetric with respect to the cell boundary, they are considered placed to be substantially axisymmetric with respect to the cell boundary from the standpoint of the optical proximity effect. Hence, as in the above embodiments, the magnitude of a variation in interconnect width due to the optical proximity effect can be predicted in advance, and this permits execution of OPC in the state of standard cells.

Figure 8:
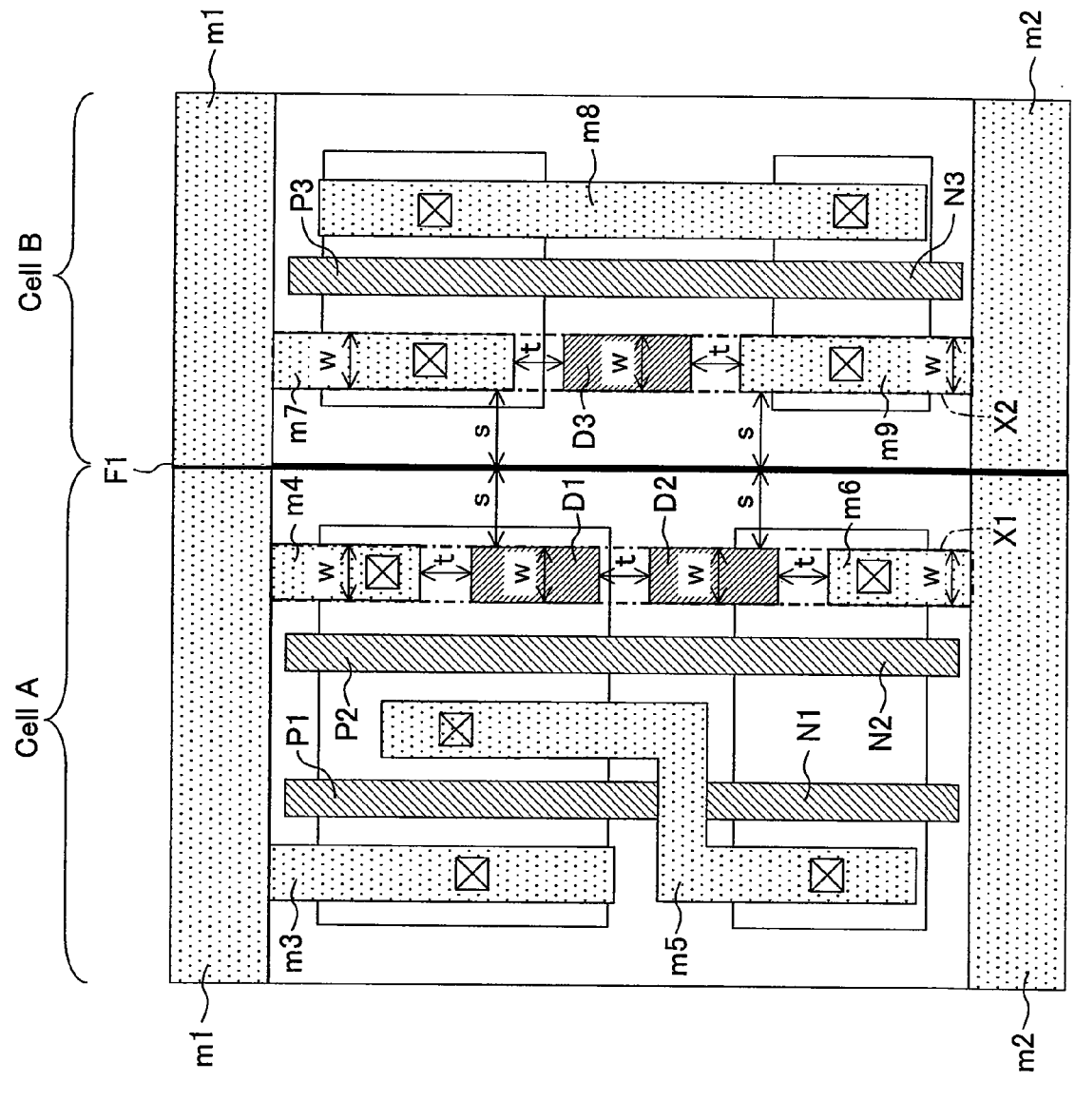
FIG. 8 is a layout plan view showing a configuration of a semiconductor integrated circuit device of Embodiment 4.

FIG. 8 is a layout plan view showing a configuration of a semiconductor integrated circuit device of Embodiment 4. In the configuration of FIG. 8, a cell A as the first standard cell and a cell B as the second standard cell are adjacent to each other along a cell boundary F1 extending in a first direction (vertical as viewed from the figure). The configurations of the cell A and the cell B are roughly the same as those in FIG. 7, except that the metal interconnects m7 and m9 in the cell B are long compared with those in FIG. 7 and only one dummy interconnect D3 is placed therebetween.

In the configuration of FIG. 8, the gap t between adjacent interconnect regions is set at a predetermined length or less with which the interconnect regions can be regarded as continuous from the standpoint of the optical proximity effect. In FIG. 8, the gap t is smaller than the interconnect width w. In this way, substantial interconnect regions X1 and X2 that extend in the direction of the cell boundary F1 and from which to the cell boundary no other interconnect region exists are placed. In the interconnect region X1, the metal interconnects m4 and m6 and the dummy interconnects D1 and D2 are placed, while in the interconnect region X2, the metal interconnects m7 and m9 and the dummy interconnect D3 are placed.

The interconnect regions X1 and X2 are substantially axisymmetric with respect to the cell boundary F1. In other words, both the interconnect regions X1 and X2 have a width of w and a distance of s to the cell boundary F1.

With the above configuration, also, the magnitude of a variation in interconnect width due to the optical proximity effect can be predicted in advance, and this permits execution of OPC in the state of standard cells. As a result, OPC is no more necessary after cell placement, and this can reduce the data amount for OPC and also shorten the OPC processing time. Also, by placing the dummy interconnects, the regions of metal interconnects can be increased, permitting regulation of the area occupation of the metal interconnect layer. Hence, the thickness of the metal interconnect layer in a cell can be kept uniform, and the yield can be improved.

Note that the dummy interconnects D1, D2, and D3 may be metal interconnects for constituting input/output terminals. Also, the dummy interconnects D1, D2, and D3 may be connected to any relevant one of the metal interconnects m4, m5, m7, and m8.

Although the substantial interconnect regions X1 and X2 are formed across the cell A and the cell B in the first direction, they may be formed partly in the respective cells.

Figure 9:
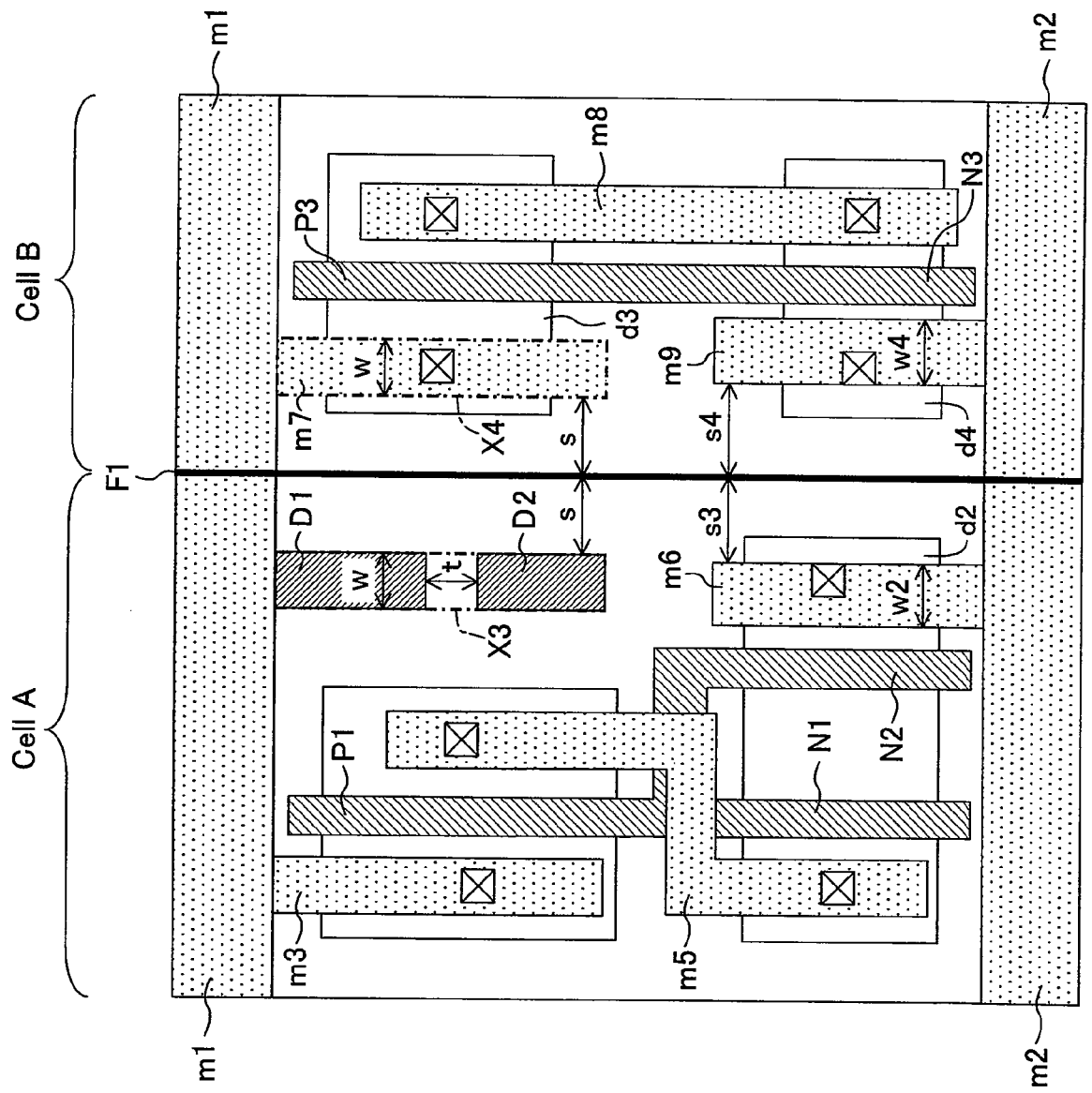
FIG. 9 is a layout plan view showing another configuration of the semiconductor integrated circuit device of Embodiment 4.

FIG. 9 is a layout plan view showing another configuration of the semiconductor integrated circuit device of this embodiment. In FIG. 9, the configurations of the cell A and the cell B are similar to those in FIG. 3. In the configuration of FIG. 9, substantial interconnect regions X3 and X4 that extend in the first direction and from which to the cell boundary F1 no other interconnect region exists are formed to be substantially axisymmetric with respect to the cell boundary F1. In other words, both the interconnect regions X3 and X4 have a width of w and a distance of s to the cell boundary F1. In this case, however, the interconnect regions X3 and X4 extend partly in the cell A and the cell B, respectively, in the first direction.

While the interconnect region X3 includes dummy interconnects D1 and D2 placed with a gap t therebetween, the interconnect region X4 includes a metal interconnect m7. Also, the interconnect regions of metal interconnects m6 and m9 are placed to be axisymmetric with respect to the cell boundary F1.

It should be noted that in the above embodiments, the substantial axisymmetry of interconnect regions with respect to the cell boundary refers to the case that the interconnect regions are substantially equal to each other in width, the distance to the cell boundary, and extension length. Being "substantially equal" as used herein means that a degree of difference with which no difference arises in the influence on an adjacent interconnect is acceptable from the standpoint of the optical proximity effect.

The "cell boundary" in the present application will be described in association with the "standard cells" additionally hereinbelow.

In the field of semiconductor integrated circuits, layout design is generally performed by placing standard cells registered in a library. Standard cells have various logic functions such as an inverter, a NAND, a NOR, a flipflop, and the like.

Figure 10:
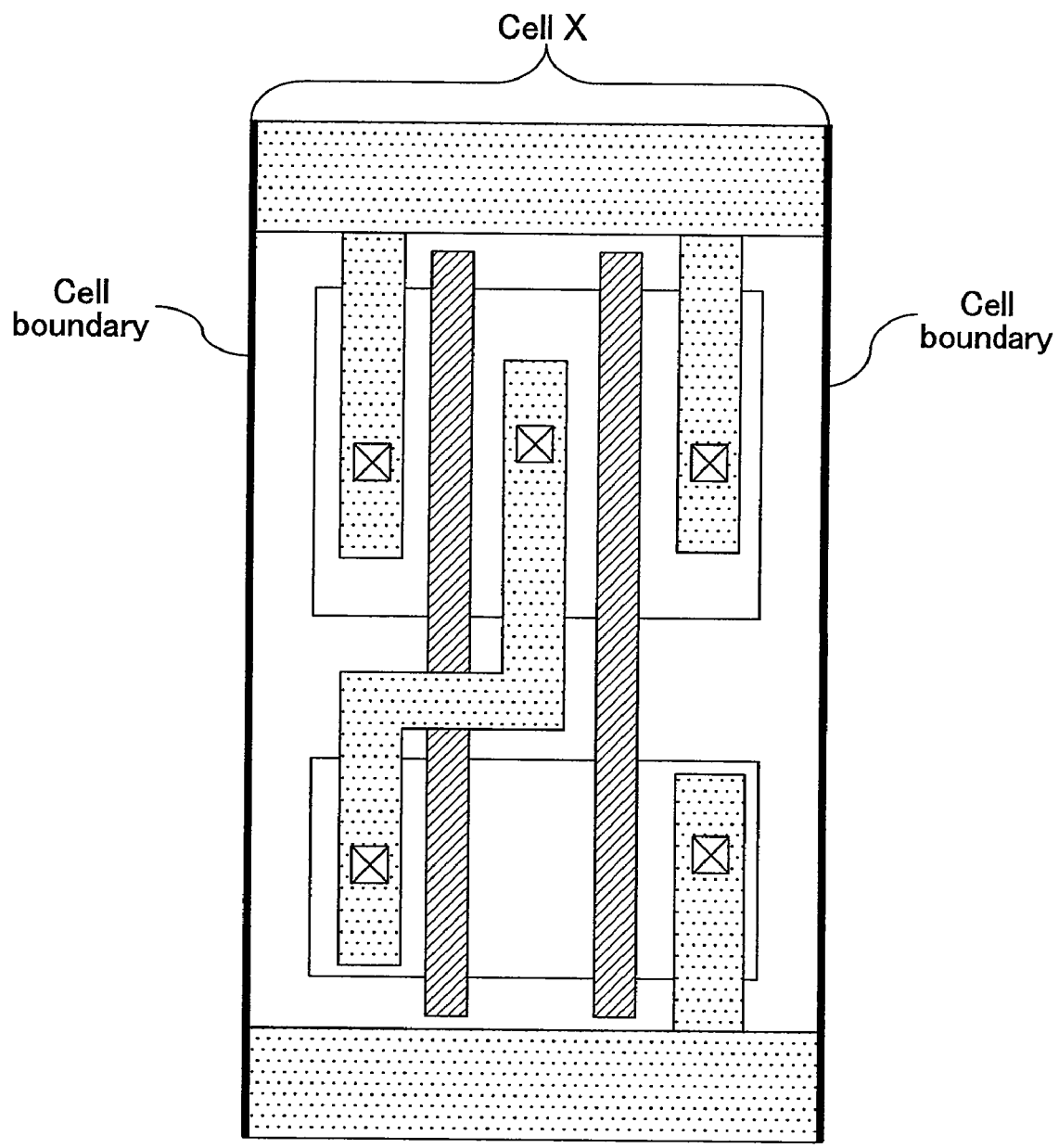
FIG. 10 shows an example of a standard cell having cell boundaries.

The layout data of a standard cell normally includes a cell boundary as that of a cell X shown in FIG. 10. In the layout design, cells (X, Y, and Z) are placed so that the cell boundaries of any adjacent cells are in contact with each other as shown in FIG. 11, to thereby prepare layout data.

Figure 12:
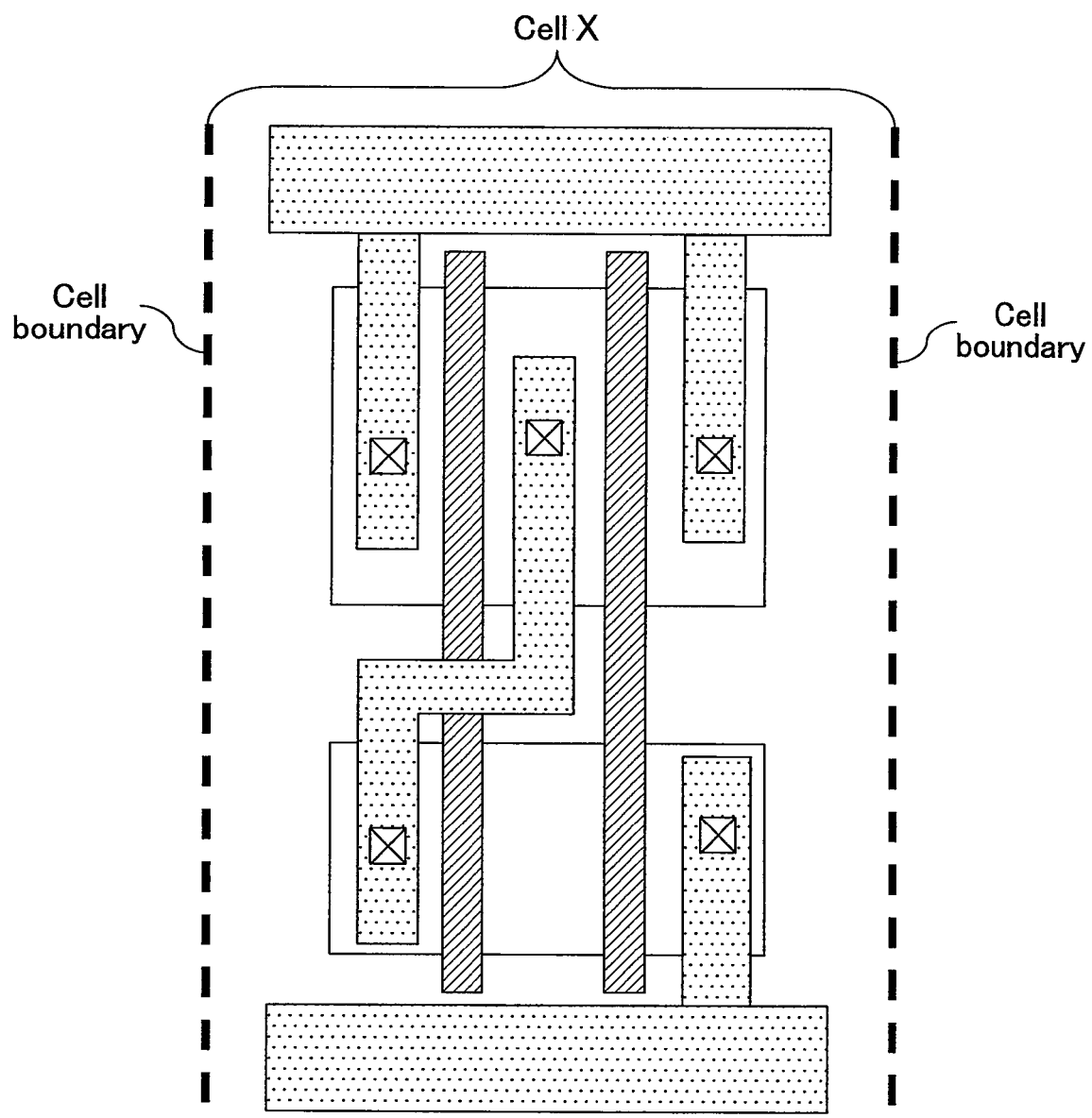
FIG. 12 shows another example of a standard cell having cell boundaries.
Figure 13:
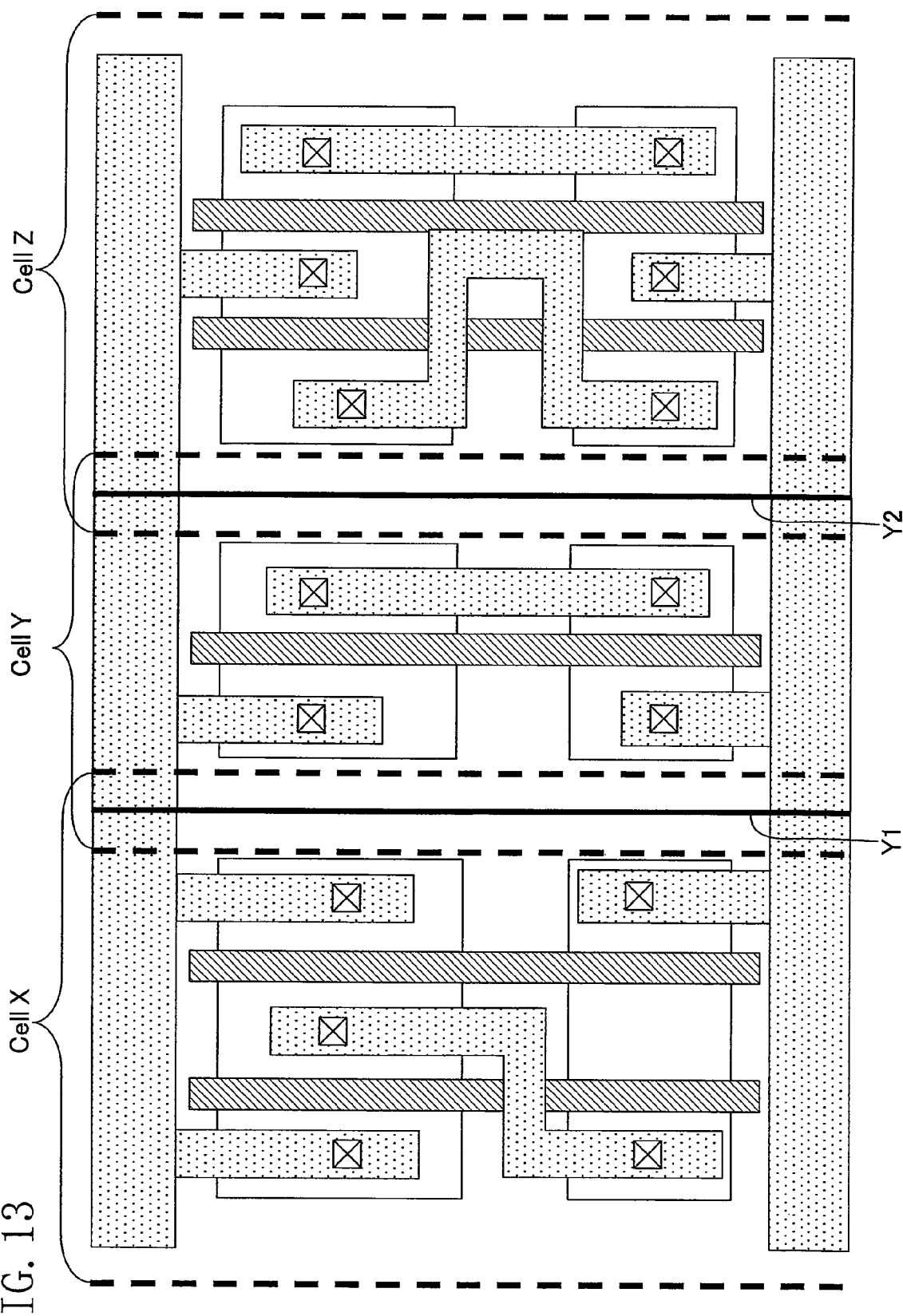
FIG. 13 shows an example of layout data using standard cells like that of FIG. 12.
Figure 14:
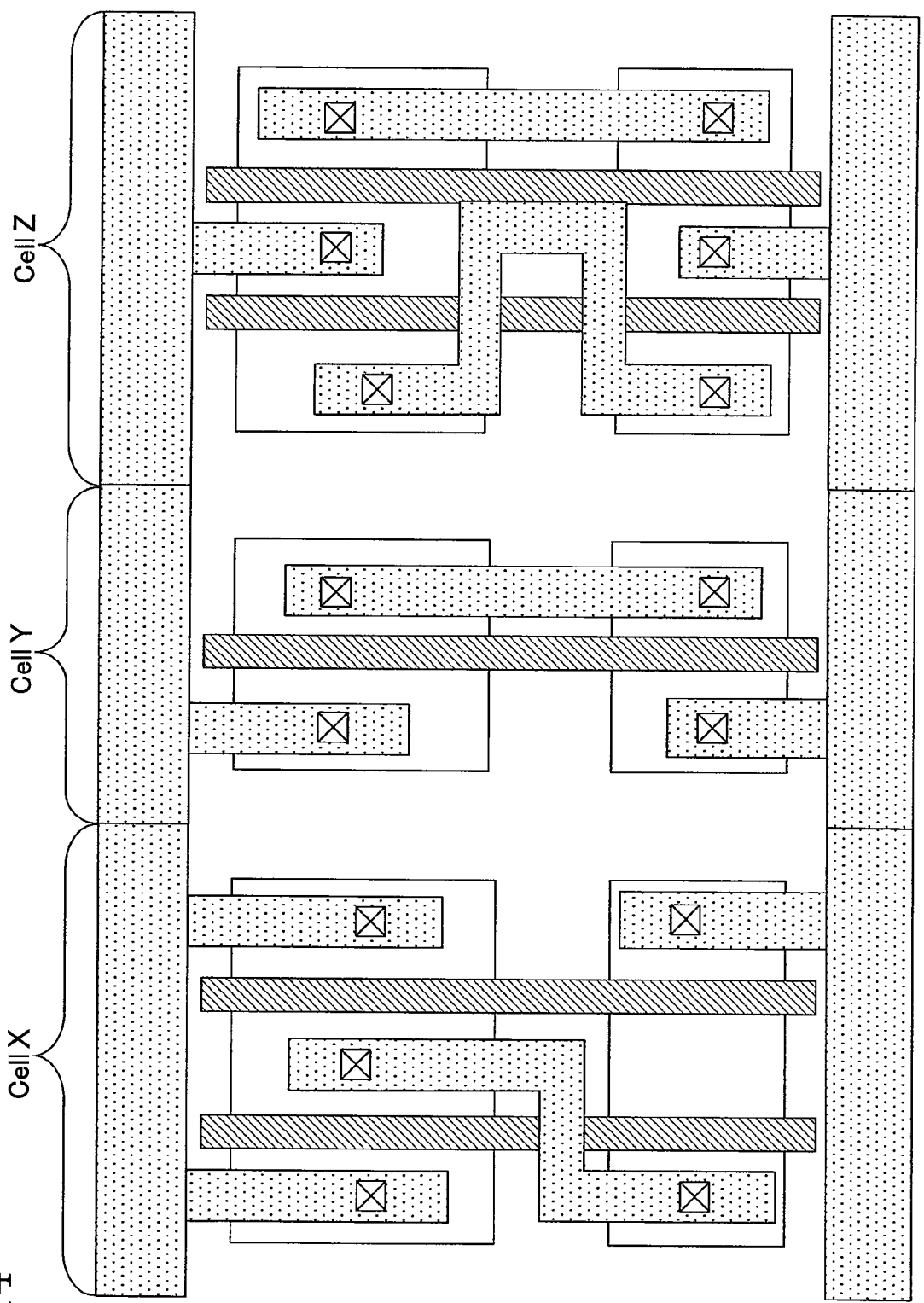
FIG. 14 shows an example of layout data using standard cells having no cell boundaries.

Such cell boundaries are, however, virtual ones provided during layout design and do not exist in the final semiconductor integrated circuit. Hence, in the layout data of a standard cell, it is not necessarily required to provide cell boundaries at the positions shown in FIG. 10. For example, cell boundaries may be formed at positions outside those in FIG. 10 as shown in FIG. 12, and adjacent cells may be placed overlapping each other as shown in FIG. 13. Otherwise, no cell boundary may be included in the layout data of a standard cell, to place cells to be adjacent to each other as shown in FIG. 14.

Figure 11:
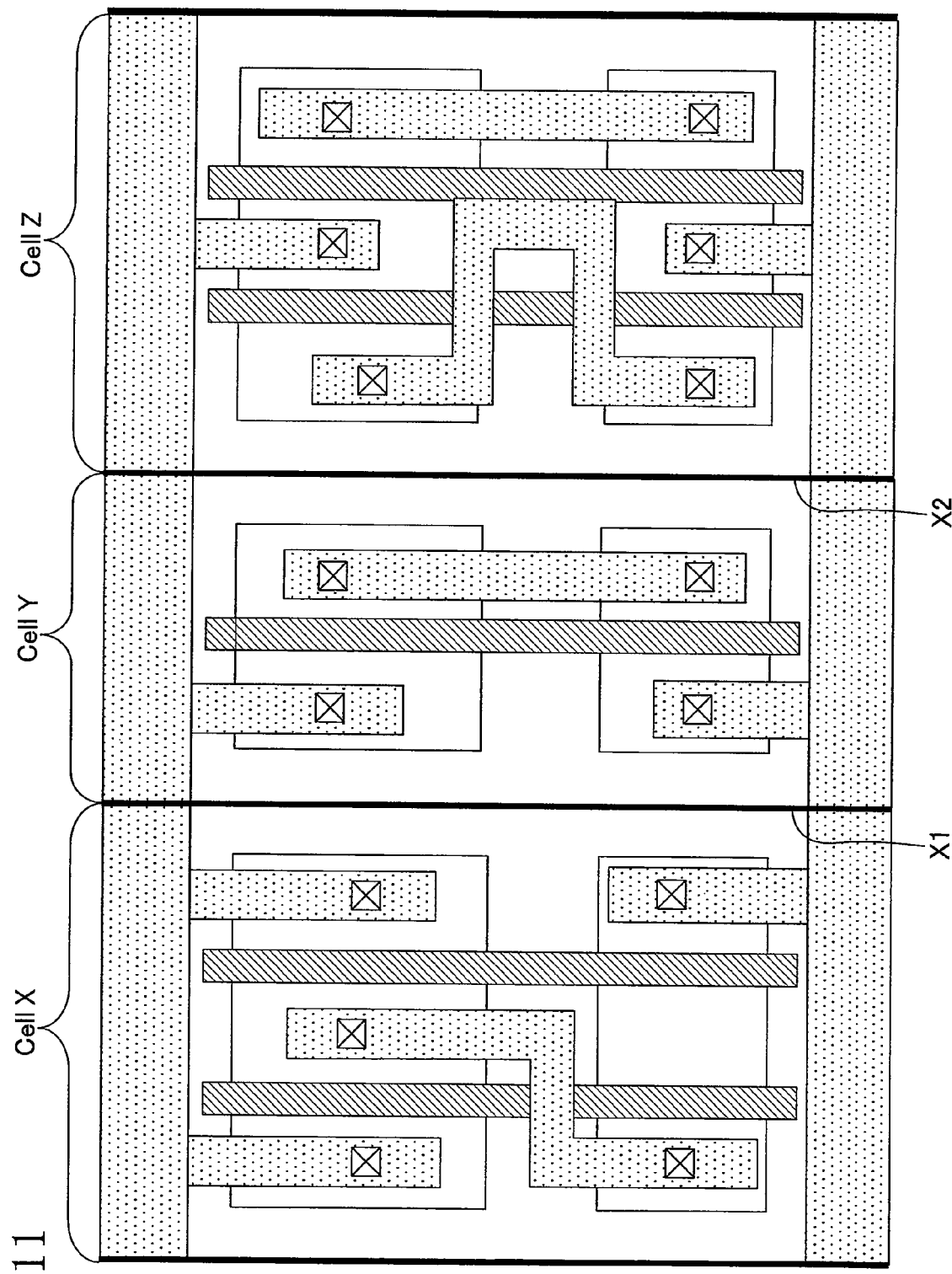
FIG. 11 shows an example of layout data using standard cells like that of FIG. 10.
Figure 15:
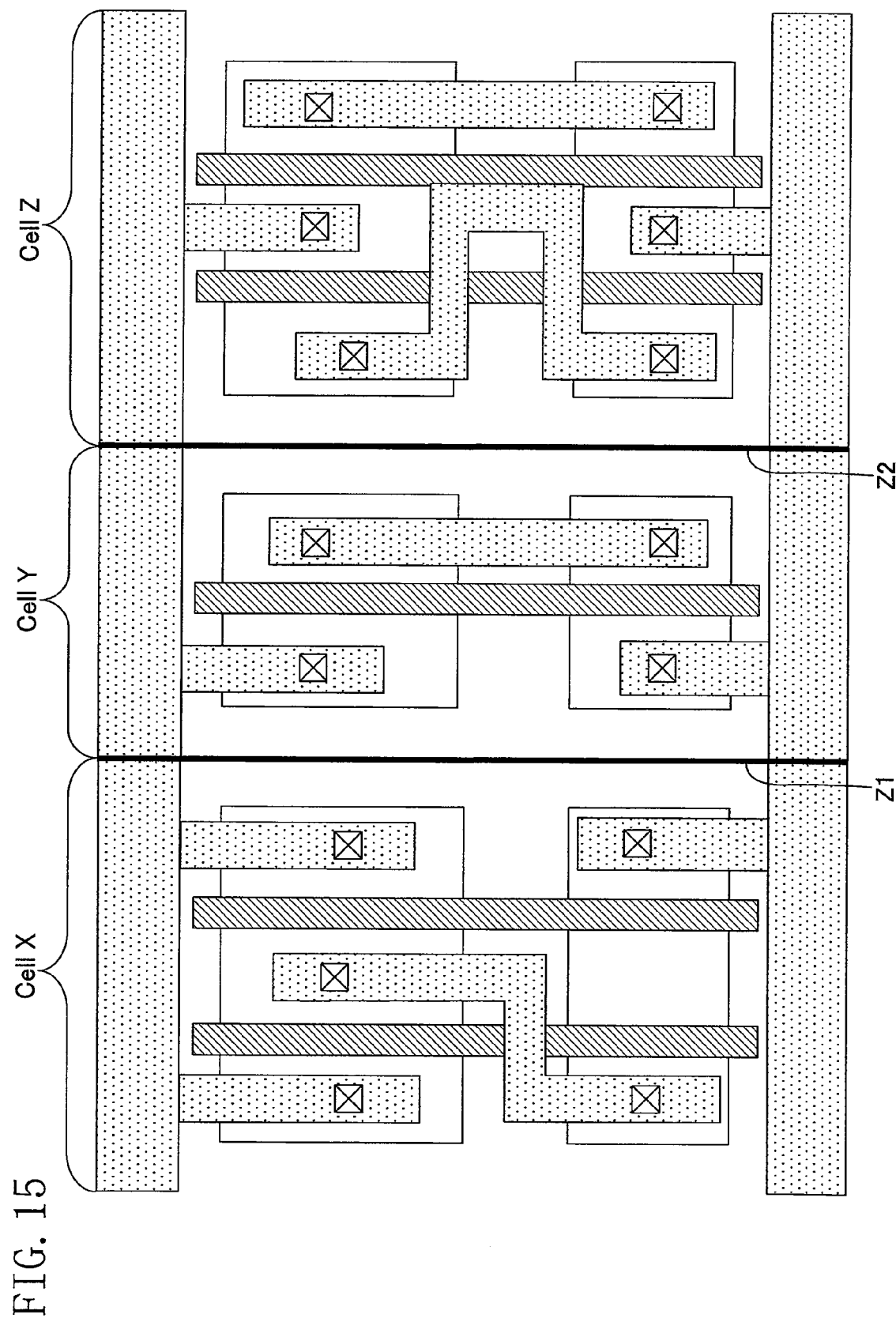
FIG. 15 is a view showing cell boundaries in the layout data of FIG. 14.

In the layout of FIG. 11, the cell boundaries coincide with positions X1 and X2 of the cell boundaries of the standard cells themselves. In the layout of FIG. 13, in which the adjacent cells overlap each other, the cell boundaries of the standard cells are located inside their adjacent cells. In this case, according to the present application, the cell boundaries are considered as being at positions Y1 and Y2 located between the cell boundaries of the standard cells themselves. In the layout of FIG. 14, which does not have any cell boundaries of the standard cells themselves, the cell boundaries are considered as being at positions Z1 and Z2 shown in FIG. 15 according to the present application.

In other words, according to the present application, in a semiconductor integrated circuit device, a block implementing one logic function is considered as one standard cell. The "block implementing a logic function" as used herein refers to a circuit block having any of various logic functions such as an inverter, a NAND, a NOR, a flipflop, and the like. A cell boundary is considered as existing at the boundary of such blocks implementing a logic function adjacent to each other.

In a "block implementing a logic function", or a standard cell, signal interconnects are not connected to any other standard cell in the same interconnect layer, but are independent therefrom. For example, as shown in FIG. 14, signal interconnects in the adjacent cells X, Y, and Z are independent from one another; signal lines are not connected among the cells. However, power supply lines are connected among the cells. In other words, by examining the configuration of the signal interconnects inside the cells, the boundary of any adjacent standard cells, that is, the position of the cell boundary can be recognized. Note that signal interconnects for connecting cells are normally formed in an interconnect layer located above the interconnect layer of the inner-cell signal interconnects.

According to the present invention, narrowing and breaking of metal interconnects closest to a cell boundary can be prevented without increasing the data amount and processing time for OPC. Hence, the present invention is useful for improving the yield of, decreasing the cost of, and shortening the development time of semiconductor integrated circuits mounted in various types of electronic equipment.

What is claimed is:

1. A semiconductor integrated circuit device comprising:
   first and second standard cells that are different in cell structure from each other and placed adjacent to each other along a cell boundary extending in a first direction, wherein in the first and second standard cells,
   metal interconnect regions, which extend in the first direction wherein no other metal interconnect region exists between the metal interconnect regions and the cell boundary, are placed to be substantially axisymmetric with respect to the cell boundary, and
   both of the metal interconnect regions are disposed over respective diffusion layers which have different side lengths in the first direction.

2. The semiconductor integrated circuit device of claim 1, wherein at least one of the metal interconnect regions is connected to a power supply line or a ground line.

3. The semiconductor integrated circuit device of claim 1, wherein at least one of the metal interconnect regions is a pattern.

4. A semiconductor integrated circuit device comprising:
   first and second standard cells that are different in cell structure from each other and placed adjacent to each other along a cell boundary extending in a first direction, wherein in the first and second standard cells,
   metal interconnect regions, which extend in the first direction wherein no other metal interconnect region exists between the metal interconnect regions and the cell boundary, are placed to be substantially axisymmetric with respect to the cell boundary, and
   in the metal interconnect regions substantially axisymmetric with respect to the cell boundary, positions of contacts are asymmetric with respect to the cell boundary.

5. The semiconductor integrated circuit device of claim 4, wherein at least one of the metal interconnect regions is connected to a power supply line or a ground line.

6. The semiconductor integrated circuit device of claim 4, wherein at least one of the metal interconnect regions is a dummy pattern.

7. The semiconductor integrated circuit device of claim 1, wherein each of the metal interconnect regions is rectangular.

8. The semiconductor integrated circuit device of claim 2, wherein said at least one of the metal interconnect regions, the power supply line and the ground line are disposed in a same metal interconnect layer.

9. The semiconductor integrated circuit device of claim 1, wherein the metal interconnect regions are connected to one of a power supply line and a ground line which are disposed in a same metal layer as the metal interconnect regions.

10. The semiconductor integrated circuit device of claim 4, wherein each of the metal interconnect regions is rectangular.

11. The semiconductor integrated circuit device of claim 5, wherein said at least one of the metal interconnect regions, the power supply line and the ground line are disposed in a same metal interconnect layer.

12. The semiconductor integrated circuit device of claim 4, wherein the metal interconnect regions are connected to one of a power supply line and a ground line which are disposed in a same metal layer as the metal interconnect regions.

13. The semiconductor integrated circuit device of claim 4, wherein numbers of the contacts in the respective metal interconnect regions are different.

14. The semiconductor integrated circuit device of claim 4, wherein the positions of the contacts are different in the first direction.

15. The semiconductor integrated circuit device of claim 4, wherein the positions of the contacts are different in a second direction perpendicular to the first direction.

16. The semiconductor integrated circuit device of claim 1, further comprising a third standard cell which is different in cell structure from the first and second standard cells and is placed adjacent to the first standard cell at an opposite side of the second standard cell along a second cell boundary extending in the first direction, wherein in the first and thirds standard cells,
   second metal interconnect regions, which extend in the first direction and from which to the second cell boundary no other metal interconnect region exists, are placed to be substantially axisymmetric with respect to the second cell boundary, and
   the second metal interconnect regions are disposed so that both of the second metal interconnect regions are disposed over respective diffusion layers which have different side lengths in the first direction, or one of the second metal interconnect regions is disposed over a diffusion layer and one of the second metal interconnect regions is not disposed over a diffusion layer.

17. The semiconductor integrated circuit device of claim 16, wherein distances from the respective metal interconnect regions to the cell boundary and distances from the respective second metal interconnect regions to the second cell boundary are equal.

18. The semiconductor integrated circuit device of claim 4, further comprising a third standard cell which is different in cell structure from the first and second standard cells and is placed adjacent to the first standard cell at an opposite side of the second standard cell along a second cell boundary extending in the first direction, wherein in the first and third standard cells,
   second metal interconnect regions, which extend in the first direction and from which to the second cell boundary no other metal interconnect region exists, are placed to be substantially axisymmetric with respect to the second cell boundary, and
   in the second metal interconnect regions substantially axisymmetric with respect to the second cell boundary, positions of contacts are asymmetric with respect to the second cell boundary.

19. The semiconductor integrated circuit device of claim 18, wherein distances from the respective metal interconnect regions to the cell boundary and distances from the respective second metal interconnect regions to the second cell boundary are equal.

20. The semiconductor integrated circuit device of claim 4, wherein:
   the metal interconnect regions are disposed so that both of the metal interconnect regions are disposed over respective diffusion layers which have different side lengths in the first direction,
   one of the metal interconnect regions located in the first standard cell includes one or more contacts which connect said one of the metal interconnect regions to one of the diffusion layers, and another one of the metal interconnect regions located in the second standard cell includes one or more contacts which connect said another one of the metal interconnect regions to another of the diffusion layers, and a number of the contacts in said one of the metal interconnect regions located in the first standard cell is different from a number of the contacts in said another one of the metal interconnect regions located in the second standard cell.

21. The semiconductor integrated circuit device of claim 4, wherein:

the metal interconnect regions are disposed so that one of the metal interconnect regions is disposed over a diffusion layer and another one of the metal interconnect regions is a dummy pattern and is not disposed over a diffusion layer, and the dummy pattern does not include a contact.

22. A semiconductor integrated circuit device comprising:

first and second standard cells that are different in cell structure from each other and placed adjacent to each other along a cell boundary extending in a first direction, wherein in the first and second standard cells, metal interconnect regions, which extend in the first direction wherein no other metal interconnect region exists between the metal interconnect regions and the cell boundary, are placed to be substantially axisymmetric with respect to the cell boundary, and one of the metal interconnect regions is disposed over a diffusion layer and one of the metal interconnect regions is not disposed over a diffusion layer.

23. The semiconductor integrated circuit device of claim 22, wherein said one of the metal interconnect regions which is not disposed over a diffusion layer is a dummy pattern.

24. The semiconductor integrated circuit device of claim 1, wherein each of the metal interconnect regions has a same length and width, and is located at a same position in the first direction and at a same distance from the cell boundary.

25. The semiconductor integrated circuit device of claim 4, wherein each of the metal interconnect regions has a same length and width, and is located at a same position in the first direction and at a same distance from the cell boundary.

* * * * *